United States Patent [19]
Narita

[11] Patent Number: 5,923,079
[45] Date of Patent: Jul. 13, 1999

[54] SINGLE-CHIP SYSTEM HAVING ELECTROSTATIC DISCHARGE (ESD) PROTECTIVE CIRCUITRY INCLUDING A SINGLE BIPOLAR TRANSISTOR PORTION

[75] Inventor: Kaoru Narita, Tokyo, Japan

[73] Assignee: NEC Corporation, Tokyo, Japan

[21] Appl. No.: 08/969,341

[22] Filed: Nov. 28, 1997

[30] Foreign Application Priority Data

Nov. 29, 1996 [JP] Japan ................................... 8-319480

[51] Int. Cl.$^6$ ............................................. H01L 27/102
[52] U.S. Cl. ..................................... 257/577; 257/355
[58] Field of Search ................................. 257/355–363, 257/577

[56] References Cited

U.S. PATENT DOCUMENTS

| | | | |
|---|---|---|---|
| 5,521,414 | 5/1996 | Palara ....................................... | 257/577 |
| 5,581,104 | 12/1996 | Lowrey et al. ........................... | 257/355 |
| 5,594,265 | 1/1997 | Shimizu et al. .......................... | 257/355 |
| 5,670,814 | 9/1997 | Wu et al. .................................. | 257/355 |
| 5,710,452 | 1/1998 | Narita ....................................... | 257/355 |
| 5,721,656 | 2/1998 | Wu et al. .................................. | 257/355 |

FOREIGN PATENT DOCUMENTS

| | | |
|---|---|---|
| 3-91264 | 4/1991 | Japan . |
| 7-86510 | 3/1995 | Japan . |

OTHER PUBLICATIONS

Charvaka Duvvury, et al, "Achieving Uniform nMOS Device Power Distribution for Sub–micron ED Reliability", IEEE, Apr. 1992, pp. 6.1.1–6.1.4.

*Primary Examiner*—David B. Hardy
*Attorney, Agent, or Firm*—McGinn & Gibb, P.C.

[57] ABSTRACT

To protect a system efficiently from static electricity and electrostatic discharge (ESD) and thereby prevent the system from becoming defective, a system formed on a first conductivity-type semiconductor substrate includes a pad for receiving a signal, a protection element connected to the pad, and a discharge line connected to the protection element. The protection element includes a single bipolar transistor portion and at least one diode portion located adjacent to the bipolar transistor portion.

17 Claims, 5 Drawing Sheets

SINGLE-CHIP SYSTEM HAVING ELECTROSTATIC DISCHARGE (ESD) PROTECTIVE CIRCUITRY INCLUDING A SINGLE BIPOLAR TRANSISTOR PORTION

BACKGROUND OF THE INVENTION

The present invention generally relates to a single-chip system (e.g., a central processing unit (CPU), a dynamic random access memory (DRAM) system), and more particularly to a system having a circuit for protecting the system from static electricity (e.g., electrostatic discharge) and an internal circuit from electrostatic breakdown.

DESCRIPTION OF THE RELATED ART

With recent advancements in fabricating a single-chip semiconductor system (e.g., a central processing unit (CPU), a dynamic random access memory (DRAM) system) have become highly integrated, and a chip size of the system has become smaller. Therefore, for example, metal oxide semiconductor (MOS) transistors or diodes, formed in the single-chip semiconductor system, have a low break-down voltage. Thus, the MOS transistors and the diodes in the single-chip semiconductor system are broken easily when static electricity occurs in the single-chip semiconductor system.

For protecting the system from static electricity, conventional single-chip semiconductor systems in Japanese Laid-open Patent Application No. Hei 3-91264 and Japanese Laid-open Patent Application No. Hei 7-86510 have a static electricity protector which is a circuit for protecting the system from static electricity and electrostatic discharge (ESD) and breakdown.

FIG. 1 illustrates the static electricity protector in Japanese Laid-open Patent Application No. Hei 7-86510, which includes a plurality of metal pads 11, a metal line 12 (e.g., aluminum), a plurality of parasitic bipolar transistors 13, and a plurality of diodes 14. A collector of the parasitic bipolar transistors 13 is connected to the metal pad 11, an emitter of the parasitic bipolar transistors 13 is connected to the metal line 12, and a base of the parasitic bipolar transistors 13 is connected to the emitter. A P-type region of the diode 14 is connected to the metal pad 11, and an N-type region of the diode 14 is connected to the metal line 12.

Therefore, even if extraordinarily high voltage caused by static electricity applies between any two metal pads of the plurality of the metal pads 11, an internal circuit (not shown in FIG. 1) connected to the metal pads 11 is not broken, because the static electricity is discharged by a "voltage clamping effect". Specifically, the voltage clamping effect discharges the static electricity on one of the metal pads 11 to the other metal pads 11 by using the parasitic bipolar transistors 13 and the diodes 14.

As mentioned above, the single-chip system having the static electricity protector circuit structure of FIG. 1, ideally, can operate stably and correctly.

However, in practice, the static electricity protector in FIG. 1 does not work very well, when it has a structure and layout such as in FIG. 2.

FIG. 2 shows an exemplary diagram of the static electricity protector in FIG. 1, as a related art system (it is a related art system, but not a prior art system). In FIG. 2, the metal pad 11 has a ladder portion 15 having a plurality of fingers. The metal line 12 also has fingers for forming the parasitic bipolar transistors 13 and the diodes 14. In FIG. 2, there are two parasitic bipolar transistor portions 13a and 13b, and three diode portions 14a, 14b, and 14c, which consist of $N^+$ impurity diffusion regions $17_1$–$17_6$ and $P^+$ impurity diffusion regions $18_1$–$18_3$ in a P-type silicon substrate. A contact hole 16 is used for connecting electrically either the metal pad 11 or the metal line 12 to one of the impurity diffusion regions.

When the positive extraordinary voltage is applied to the pad 11, a breakdown occurs at any one of the $N^+$ impurity diffusion regions $17_1$, $17_3$, $17_4$, and $17_6$ connected to the pad 11. For exemplary purposes, the breakdown occurs at a point A of the $N^+$ impurity diffusion region $17_1$ in FIG. 2.

The potential voltage of the P-type semiconductor substrate at the point A increases, because current flows into the P-type semiconductor substrate.

Hence, the junction between the $N^+$ impurity diffusion layer $17_2$ and the P-type semiconductor substrate is biased in the forward direction. Then, the current flows to the metal line 12, and it operates as a base current. As a result, a bipolar action of the parasitic bipolar transistor starts at the point A.

Then, the bipolar action starts another bipolar action near the point A, similarly to a geometrical progression (i.e., a chain reaction). Therefore, finally, the bipolar actions occur in the whole region 13a.

However, an increasing of a voltage level in the whole region 13a does not increase a voltage level in the region 13b, because the $P^+$ impurity diffusion region $18_2$ is formed between the regions 13a and 13b. Therefore, the static electricity protector in FIG. 2 cannot operate to its fill potential and capability since only half of the structure portion operates as a transistor.

The voltage clamp's capability is decreased, and the bipolar transistor 13 may be destroyed. Specifically, if the region of the bipolar action is narrow, a resistance of the current path in the static electricity protector increases. Consequently, the voltage clamp's protective capability is lowered, and also the current density passing through the bipolar transistor 13 is increased. Thus, the junction deterioration is induced, and ultimately, the bipolar transistor 13 may be destroyed.

Thus, as mentioned above, the conventional single-chip semiconductor system cannot be protected from the static electricity efficiently. This is a problem.

SUMMARY OF THE INVENTION

In view of the foregoing and other problems of the conventional systems, it is therefore an object of the present invention to provide an improved single-chip semiconductor system.

It is another object of the present invention to provide an improved static electricity protector for the single-chip semiconductor system.

In a first aspect, a system formed on a first conductivity-type semiconductor substrate according to the present invention includes a pad for receiving a signal, an internal circuit connected to the pad, a discharge line, and a static electricity protector connected to the pad and the discharge line, wherein the static electricity protector includes a single bipolar transistor portion and at least one diode portion located adjacent to the bipolar transistor portion.

With the unique and unobvious structure of the present invention, the static electricity protector includes a single bipolar transistor portion and at least one diode portion located adjacent to the bipolar transistor portion. Therefore, the bipolar action occurs everywhere in the bipolar transistor portion, when the electrostatic breakdown occurs. As a result, the system according to the present invention is protected efficiently and strongly, as compared with the conventional systems described above.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
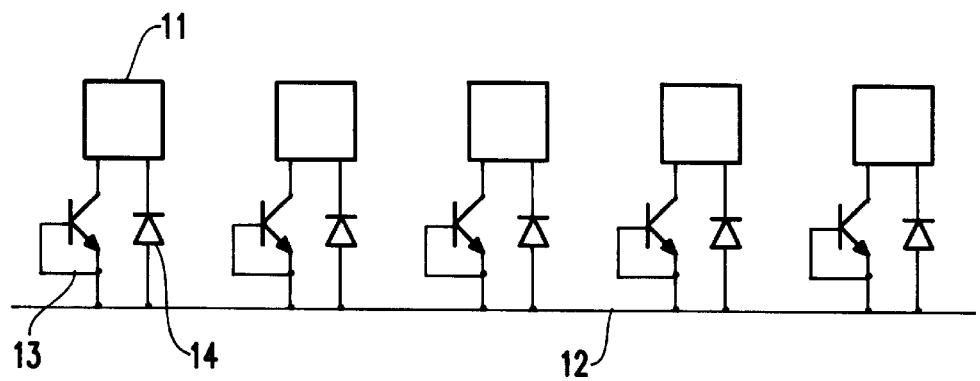
FIG. 1 is a circuit diagram of a static electricity protector in a conventional single-chip system.
Figure 2:
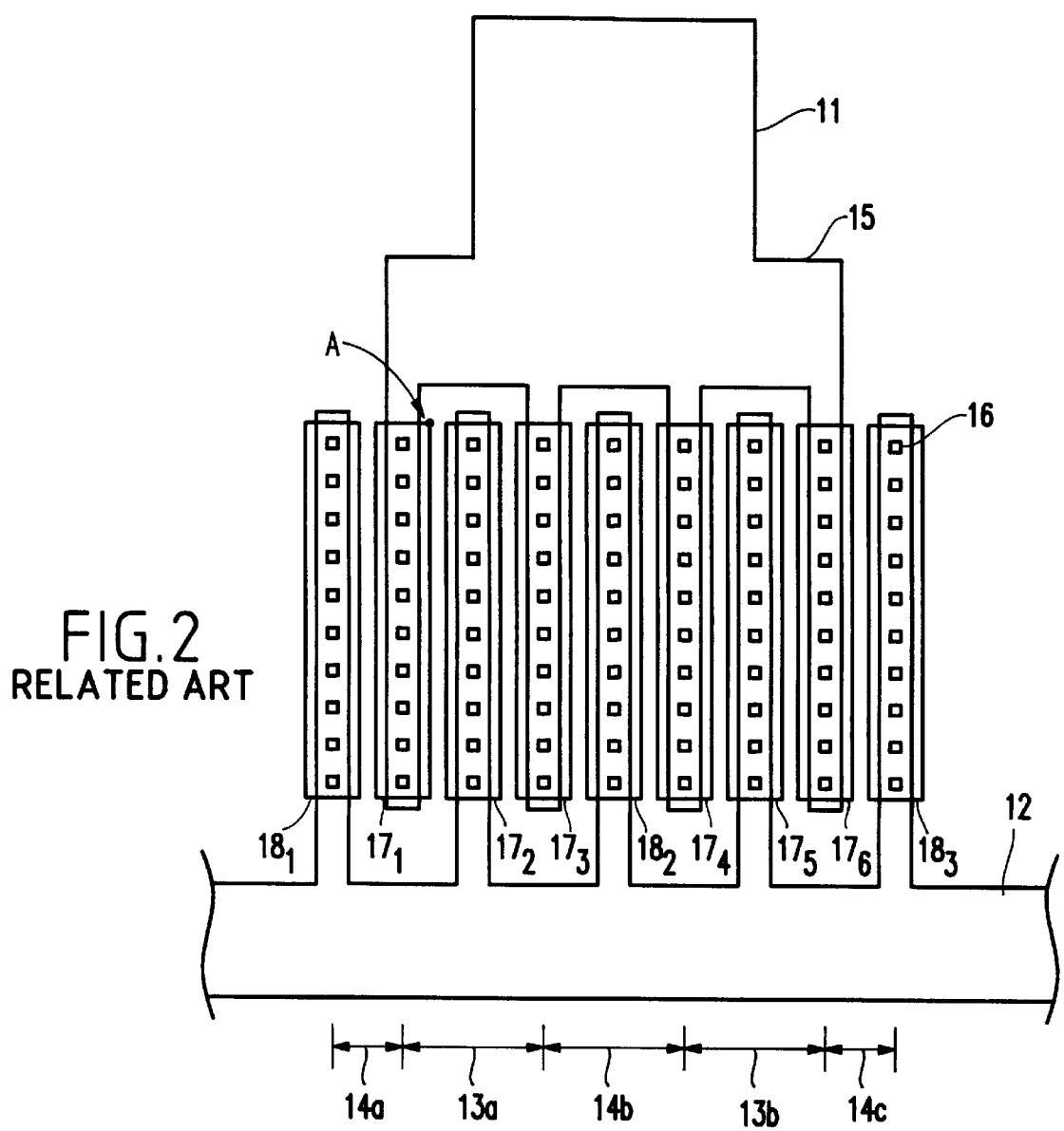
FIG. 2 is a detailed circuit diagram of a static electricity protector in a related art single -hip system (e.g., related art but not prior art)

Referring now to the drawings, and more particularly to FIGS. 3–7, a single-chip semiconductor dynamic random access (DRAM) memory system 60 is described according to an embodiment of the present invention.

In the embodiment, the DRAM system 60 includes a discharge line 51 for discharging static electricity, a plurality of static electricity protectors 50 connected to the discharge line 51, metal pads 26a–26d connected to the static electricity protectors 50, a row decoder 52, a column decoder 53, a cell array (e.g., a DRAM cell array) 54 including a plurality of bit lines (not shown), word lines (not shown), and a sense amplifier (not shown), and an input/output circuit 55.

The metal pads 26a–26d are respectively connected to corresponding leads (e.g., metal wire)(not shown), and then, the DRAM system 60 is molded by using resin.

Figure 3:
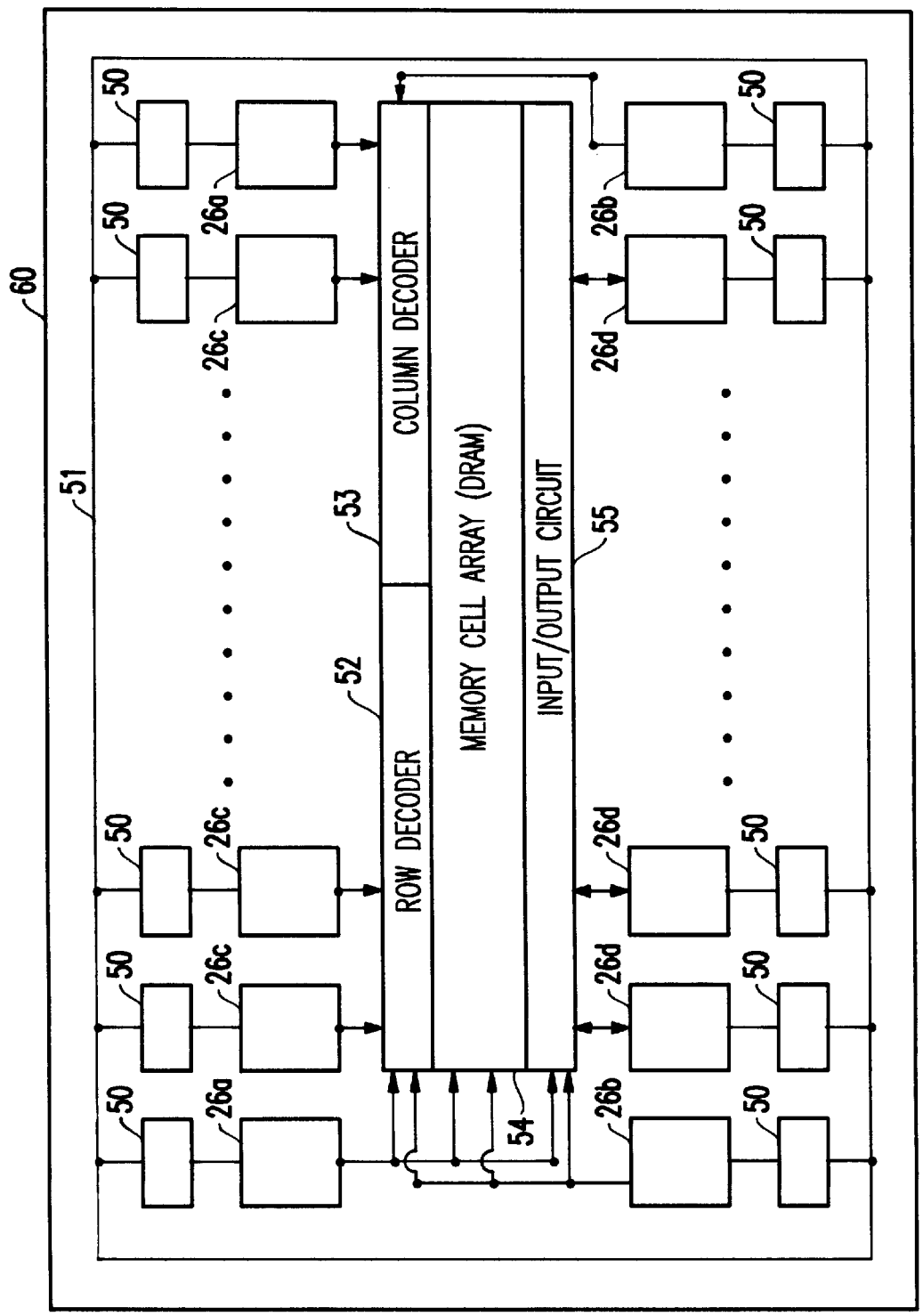
FIG. 3 is a diagram of a single-chip semiconductor dynamic random access memory (DRAM) system according to the present invention.

In FIG. 3, for example, the metal pads 26a are used for receiving a ground voltage (e.g., 0 V), the metal pads 26b are used for receiving a high voltage Vcc (e.g., Vcc >0 V), the metal pads 26c are used for receiving address signals, and the metal pads 26d are used for inputting or outputting data. The row decoder 52, the column decoder 53, the DRAM cell array 54 and the input/output circuit 55 receive the ground voltage and the high voltage Vcc for a reading operation and a writing operation.

When the reading operation is executed by an off-chip central processing unit (CPU), the row decoder 52 decodes the address signals and activates a corresponding word line. The column decoder 53 decodes the address signals and selects corresponding bit lines. Then, the sense amplifier amplifies data from the DRAM cells connected to the corresponding word line and bit lines. The data are outputted to the metal pads 26d.

When the writing operation is executed by an off-chip CPU, the row decoder 52 decodes the address signals and activates a corresponding word line. The column decoder 53 decodes the address signals and selects corresponding bit lines. Then, the data from the metal pads 26d are stored in the DRAM cells.

Figure 4:
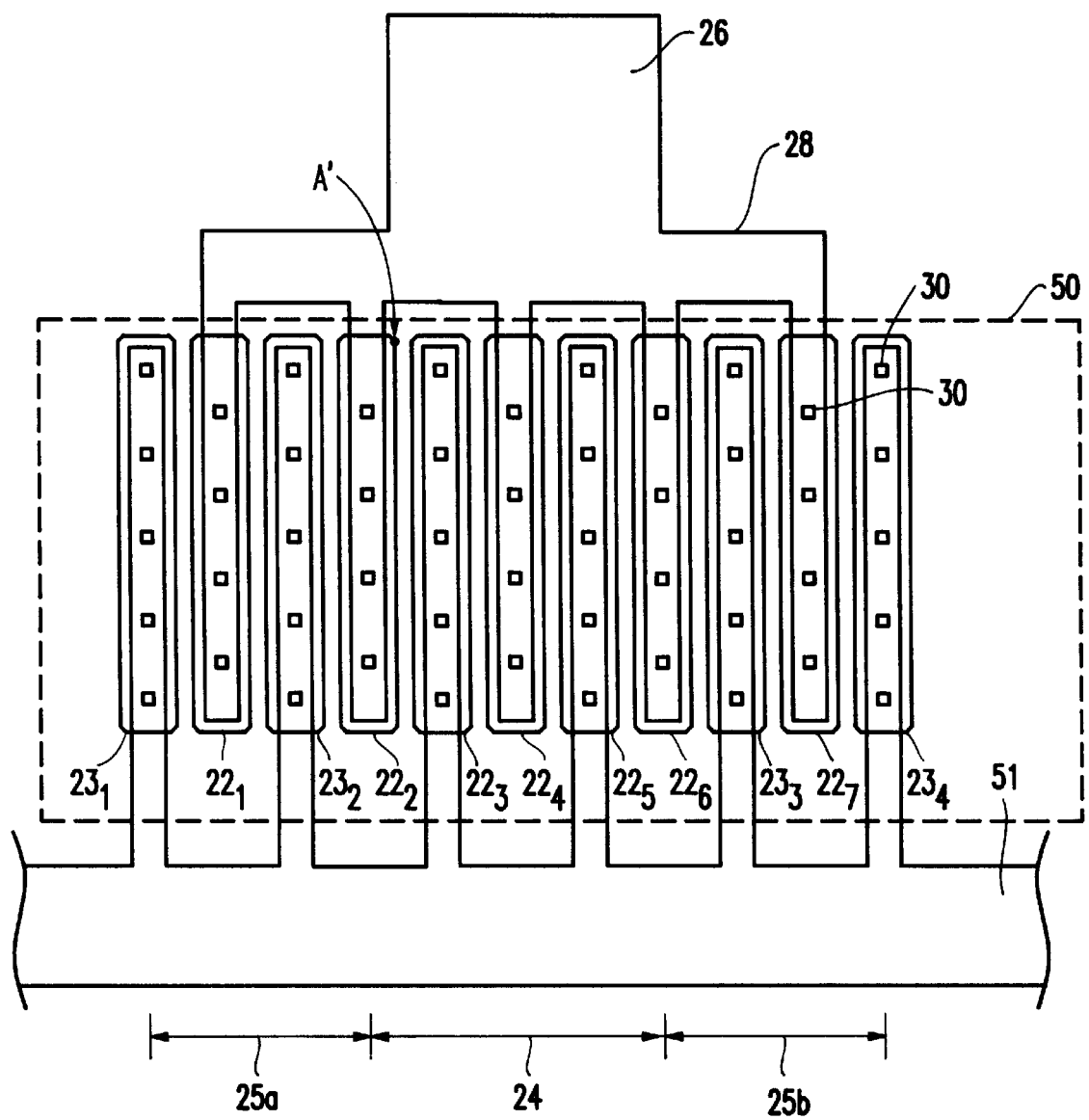
FIG. 4 is a detailed circuit diagram of a static electricity protector in the Single-chip semiconductor DRAM system according to the present invention.

FIG. 4 illustrates in detail the static electricity protector 50 according to the present invention. In FIG. 4, a metal pad 26 represents one of the metal pads 26a–26d.

The metal pad 26 has a ladder portion 28 having a plurality of fingers. The discharge line 51 also has a substantially ladder-like shape having a plurality of fingers for forming the parasitic bipolar transistors and the diodes having a circuit connection shown in FIG. 1. In FIG. 4, there are one parasitic bipolar transistor portion 24, and two diode portions 25a and 25b, which consist of $N^+$ impurity diffusion regions $22_1$–$22_7$ and $P^+$ impurity diffusion regions $23_1$–$23_4$ in a P-type silicon substrate 21. The $N^+$ impurity diffusion regions $22_1$–$22_7$ and $P^+$ impurity diffusion regions $23_1$–$23_4$ have a substantially rectangular shape, and an exemplary length of the longer side of the shape is about 50 $\mu$m. Contact holes 30 are used for connecting electrically the metal pad 26 or the discharge line 51 to one of the impurity diffusion regions.

Figure 5:
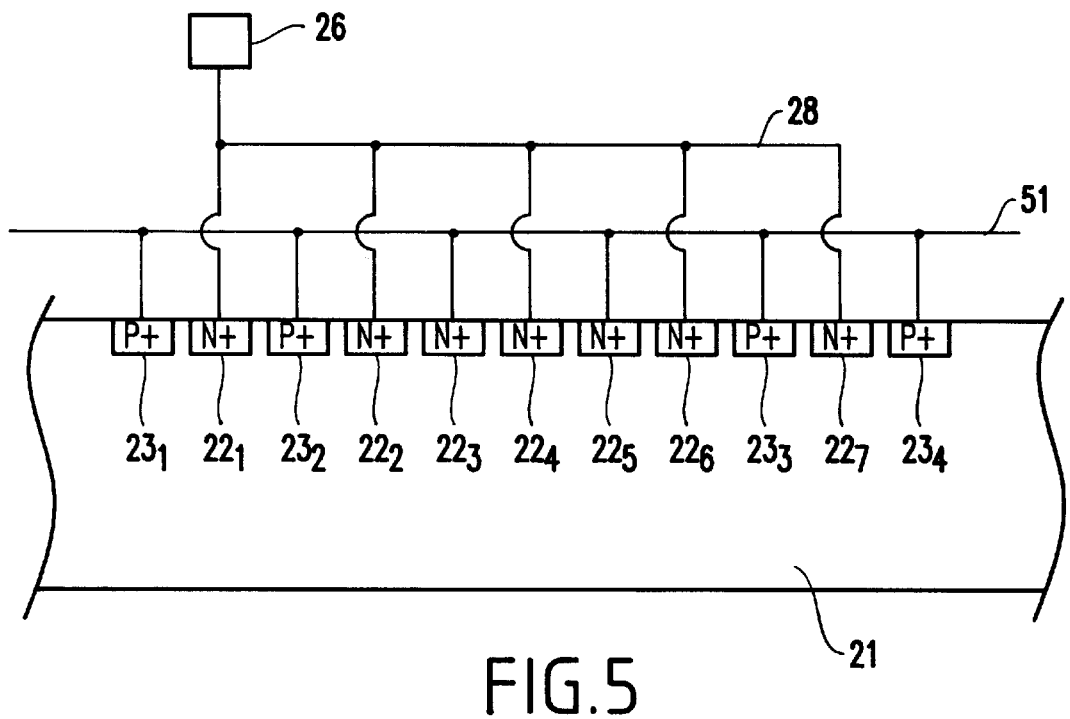
FIG. 5 is a circuit diagram of a cross-section of a static electricity protector according to the present invention.

FIG. 5 shows a circuit diagram for showing a relationship between the $N^+$ impurity diffusion regions $22_1$–$22_7$ and $P^+$, impurity diffusion regions $23_1$–$23_4$. There is no diode portion in a middle part of the static electricity protector 50, and that the diode portions are located at a side of the static electricity protector 50.

Figure 6:
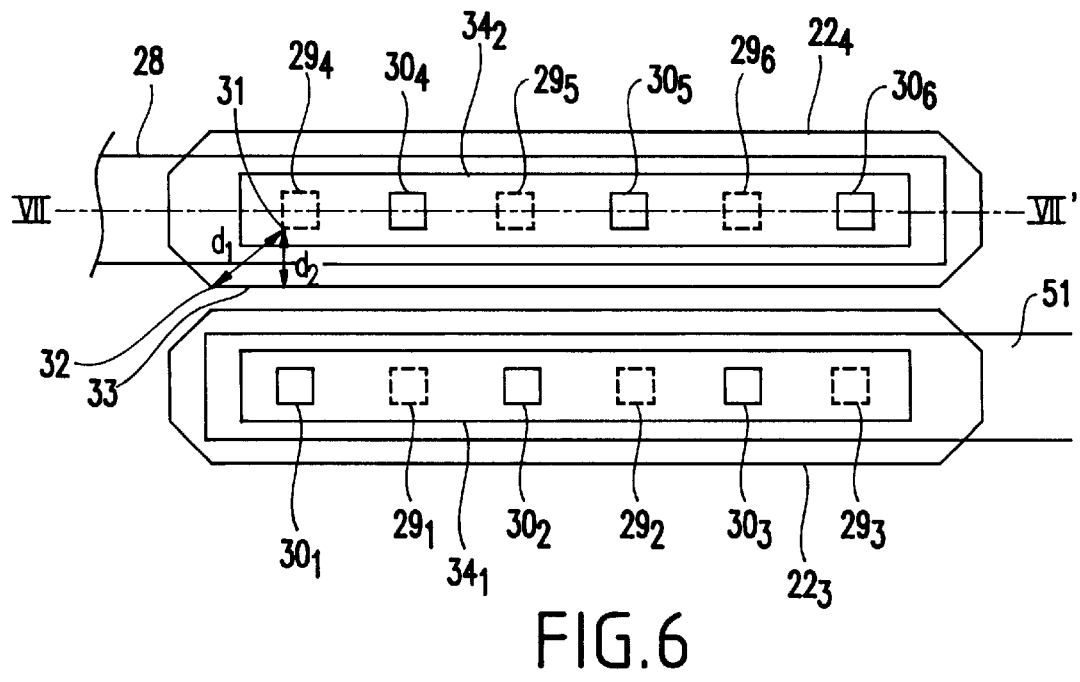
FIG. 6 is a detailed diagram of diffusion regions according to the present invention.

FIG. 6 shows the cross section of the $N^+$ impurity diffusion layers $22_3$ and $22_4$ which are shown in FIG. 5. There are contact holes $30_1$–$30_6$ (which are shown as a numeral 30 in FIG. 4). Further, there are internal contact holes $29_1$–$29_6$.

Four corners of the $N^+$ impurity diffusion layers $22_3$ and $22_4$ have obtuse angles, thereby producing an angled or "linear rounding" of first and second each of layers $22_3$ and $22_4$. A distance $d_1$ from one corner 31 of the internal contact hole $29_4$ to one corner 32 of the $N^+$ impurity diffusion layers $22_4$ is longer than a distance $d_2$ from the corner 31 to a side portion 33 of the $N^+$ impurity diffusion layer $22_4$ (e.g., the line representing distance $d_2$ being substantially perpendicular to a plane formed by one of the sides of the contact hole $29_4$).

Further, the internal contact holes $29_1$–$29_3$ are formed at positions opposite to the internal contact holes $29_4$–$29_6$, and also the contact holes $30_1$–$30_3$ are formed at positions opposite to the contact holes $30_4$–$30_6$. That is, a distance from the contact hole $30_1$ to the contact hole $30_4$ and a distance from the contact hole $30_2$ to the contact hole $30_4$ are the same (e.g., equidistant). Similarly, a distance from the contact hole $30_2$ to the contact hole $30_5$ and a distance from the contact hole $30_3$ to the contact hole $30_5$ are the same.

A distance from the internal contact hole $29_1$ to the internal contact hole $29_4$ and a distance from the internal contact hole $29_5$ to the internal contact hole $29_1$ are the same. Similarly, a distance from the internal contact hole $29_2$ to the internal contact hole $29_5$ and a distance from the internal contact hole $29_2$ to the internal contact hole $29_6$ are the same.

The $N^+$ impurity diffusion layer $22_3$ is connected to an intermediate conductive layer $34_1$ through the internal contact holes $29_1$–$29_3$, and also connected to the discharge line 51 through the intermediate conductive layer $34_1$ and the contact holes $30_1$–$30_3$. The $N^+$ impurity diffusion layer $22_4$ is connected to the intermediate conductive layer $34_2$ through the internal contact holes $29_4$–$29_6$, and also connected to the ladder portion 28 through the intermediate conductive layer $34_2$ and the contact holes $30_4$–$30_6$.

Figure 7:
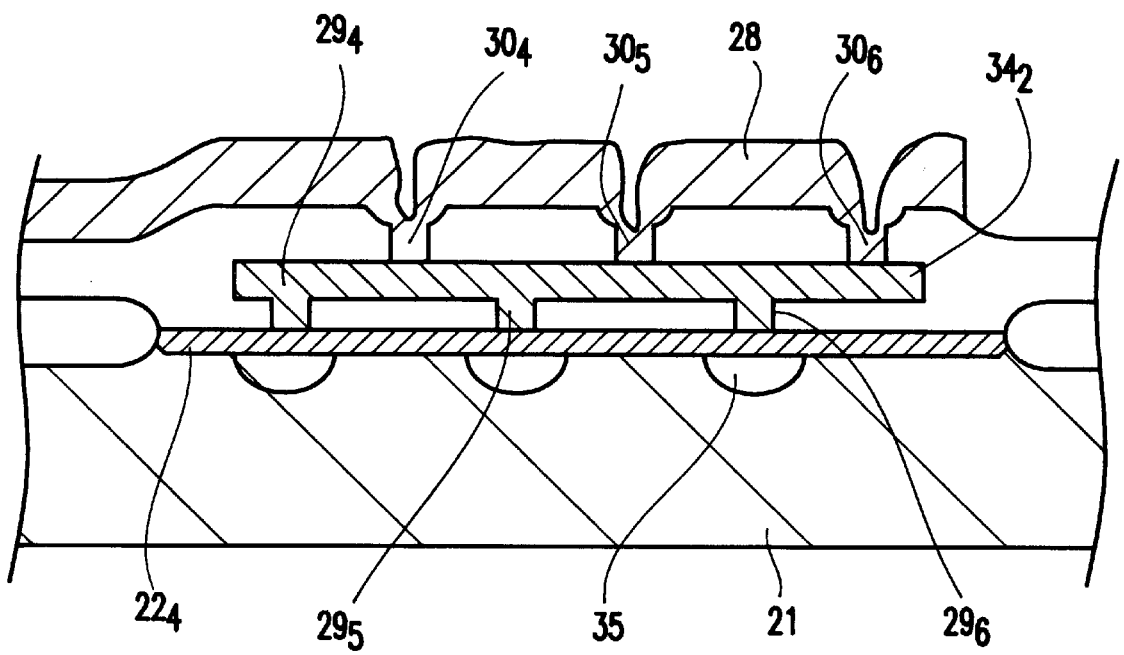
FIG. 7 is a diagram of device structure at line VII-VII' in FIG. 6 according to the present invention.

FIG. 7 shows a cross-sectional view at a line VII-VII' in FIG. 6, for showing a device structure. The intermediate conductive layers $34_1$ and $34_2$ are formed by using at least one of a high melting point metal, a silicide, a polycrystalline silicon, or a multilayer thereof. An N$^+$ impurity diffusion layer 35 deeper than the N$^+$ impurity diffusion layer $22_4$ is formed on the P-type semiconductor substrate 21 corresponding to positions of the contact holes $29_4$–$29_6$, under the N$^+$ impurity diffusion layer $22_4$. The N$^+$ impurity diffusion layers 35 are formed by implanting an impurity after the internal contact holes $29_4$–$29_6$ have been opened.

When the positive (e.g., "+") extraordinary voltage is applied to the pad 26, a breakdown occurs at any one of the N$^+$ impurity diffusion regions $22_1$, $22_3$, $22_4$, $22_6$, and $22_7$. In this explanation, for example, the breakdown occurs at a point A' of the N$^+$ impurity diffusion region $22_2$ in FIG. 4.

Then, current flows into the P-type semiconductor substrate 21, and a potential voltage at the P-type semiconductor substrate 21 at the point A' increases. Therefore, the junction between the N$^+$ impurity diffusion layer $22_3$ and the P-type semiconductor substrate 21 is biased in the forward direction. As a result, the current flows to the discharge line 51. The current operates as a base current. As a result, a bipolar action of the parasitic bipolar transistor is started at the point A'.

Then, the bipolar action triggers another bipolar action near the point A'. Therefore, finally, the bipolar actions occur throughout the whole region 24. According to an experiment, the propagation speed of the bipolar action is about 40 nsec for propagating 100 μm.

As mentioned above, according to the embodiment, the parasitic bipolar transistor portion 24 works efficiently as the parasitic bipolar transistor, because the parasitic bipolar transistor portion 24 is not divided into two portions by the P$^+$ impurity diffusion region. Thus, the transistor portion is larger and centrally positioned.

Moreover, the angles at the four corners of each of the N$^+$ impurity diffusion layers $22_1$–$22_7$ have obtuse angles, as opposed to being rectangular (e.g., forming substantially right angles) as in the conventional systems. Therefore, an excessive current concentration does not occur, when the junction breakdown occurs at one corner of the N$^+$ impurity diffusion layers $22_1$–$22_7$, and thus damage is minimized.

The junction breakdown may occur at the four corners of the N$^+$ impurity diffusion regions $22_1$–$22_7$. However, a current density can be suppressed by the resistance of the N$^+$ impurity diffusion layers $22_1$–$22_7$ themselves, because the distance $d_1$ is longer than the distance $d_2$.

Further, the internal contact holes $29_1$–$29_3$ in the N$^+$ impurity diffusion layer $22_3$ are not positioned opposite to the internal contact holes $29_4$–$29_6$ in the N$^+$ impurity diffusion layer $22_4$, as in the conventional arrangement. Instead, the contacts are offset (staggered) from one another. Therefore, for example, a current path from the internal contact hole $29_4$ to the internal contact hole $29_1$ can be made relatively long, as compared with the current path when these contacts are positioned opposite to each other. Thus, the resistance is made larger. Accordingly, the resistance caused by the N$^+$ impurity diffusion layers $22_1$–$22_7$ decreases the current.

Also, the N$^+$ impurity diffusion layer 35 is deeper than the N$^+$ impurity diffusion layers 22. Therefore, the junction breakdown under the contact holes $29_1$–$29_6$ may be prevented.

In practice, in an area of 50×50 μm$^2$, five N$^+$ impurity diffusion layers $22_2$–$22_6$, each having lengths of 50 μm, are arranged in parallel. Therefore, the parasitic bipolar transistor portion 24 can work as the parasitic bipolar transistor in less than 20 nsec. Preferably, the length of the N$^+$ impurity diffusion layer 22 is less than 100 μm, and the area of the parasitic bipolar transistor portion 24 is less than 100×100 μm$^2$.

Furthermore, the diffusion layers 22 and 23 are formed parallel along a direction from the metal pad 26 to the discharge line 51. Therefore, the current path is minimized.

In the explanation above, the total number of the N$^+$ impurity diffusion layers 22 in the parasitic bipolar transistor portion 24 is five. However, it is not limited to five, but odd integers greater than 3 may be employed. The shapes of the contact holes 29 and 30 may be freely determined.

Although the P-type semiconductor substrate 21 is used in the above-mentioned embodiment, the same structure may be provided according to the present invention by using an N-type semiconductor substrate. Similarly, a PNP-type parasitic bipolar transistor may be provided.

While the invention has been described in terms of a preferred embodiment, those skilled in the art will recognize that the invention can be practiced with modification within the spirit and scope of the appended claims.

Having thus described my invention, what I claim as new and desire to secure by Letters Patent is as follows:

1. A single-chip system formed on a substrate, comprising:
   a pad for receiving a signal;
   a protection element connected to said pad; and
   a discharge line connected to said protection element,
   wherein said protection element comprises a single bipolar transistor portion and at least one diode portion located adjacent to said bipolar transistor portion,
   wherein said substrate comprises a first conductivity-type semiconductor substrate, and wherein said bipolar transistor portion comprises:
      a plurality of first diffusion regions having a second conductivity-type, formed in said substrate and connected to said pad; and
      a plurality of second diffusion regions having said second conductivity-type, formed in said substrate and connected to said discharge line;
   wherein said each of said first diffusion regions is located adjacent to said second diffusion regions, and ends of said first and second diffusion regions are formed with angles other than substantially ninety degrees.

2. A single-chip system formed on a substrate, comprising:
   a pad for receiving a signal;
   a protection element connected to said pad; and
   a discharge line connected to said protection element,
   wherein said protection element comprises a single bipolar transistor portion and at least one diode portion located adjacent to said bipolar transistor portion,
   wherein said substrate comprises a first conductivity-type semiconductor substrate,
   and wherein said bipolar transistor portion comprises:
      a plurality of first diffusion regions having a second conductivity-type, formed in said substrate and connected to said pad; and
      a plurality of second diffusion regions having said second conductivity-type, formed in said substrate and connected to said discharge line,
   wherein said each of said first diffusion regions is located adjacent to said second diffusion regions, wherein each of said first diffusion regions and said second diffusion regions has a substantially rectangular shape, and said first diffusion regions and said second diffusion regions are located parallel to each other, and wherein a corner of said substantially rectangular shape of said first and second diffusion regions has an obtuse angle.

3. The system as recited in claim 2, further comprising a first contact hole for connecting said first diffusion region to said pad electrically, and a second contact hole and a third contact hole for connecting said second diffusion region to said discharge line.

4. The system as recited in claim 3, wherein a distance from said first contact hole to said second contact hole and a distance from said first contact hole to said third contact hole are substantially equal.

5. The system as recited in claim 3, wherein said second contact hole is offset from said first and third contact holes.

6. The system as recited in claim 4, wherein said substrate comprises a plurality of third diffusion regions having said second conductivity-type and having a depth deeper than that of said first and second diffusion regions, under said first, second and third contact holes.

7. The system as recited in claim 6, wherein said first conductivity-type comprises a P-type and said second conductivity-type comprises an N-type.

8. The system as recited in claim 7, further comprising an internal circuit connected to said pad, wherein said internal circuit comprises a plurality of dynamic random access memory (DRAM) cells, and wherein said protection element comprises an electrostatic discharge protector.

9. An electrostatic discharge (ESD) protective circuit, formed on a substrate, for protecting a semiconductor device, comprising:

a single bipolar transistor portion; and at least one diode portion located adjacent to said bipolar transistor portion, wherein said semiconductor device includes a pad and a discharge line connected to said protective circuit, and said substrate comprises a first conductivity-type semiconductor substrate, and wherein said bipolar transistor portion comprises:

a plurality of first diffusion regions having a second conductivity-type, formed in said substrate and connected to said pad; and a plurality of second diffusion regions having said second conductivity-type, formed in said substrate and connected to said discharge line, wherein said each of said first diffusion regions is located adjacent to said second diffusion regions, and ends of said first and second diffusion regions are formed with angles other than substantially ninety degrees.

10. An electrostatic discharge (ESD) protective circuit, formed on a substrate, for protecting a semiconductor device, comprising:

a single bipolar transistor portion; and at least one diode portion located adjacent to said bipolar transistor portion, wherein said semiconductor device includes a pad and a discharge line connected to said protective circuit, and said substrate comprises a first conductivity-type semiconductor substrate, and wherein said bipolar transistor portion comprises:

a plurality of first diffusion regions having a second conductivity-type, formed in said substrate and connected to said pad; and a plurality of second diffusion regions having said second conductivity-type, formed in said substrate and connected to said discharge line, wherein said each of said first diffusion regions is located adjacent to said second diffusion regions, and each of said first diffusion regions and said second diffusion regions has a substantially rectangular shape, said first diffusion regions and said second diffusion regions being located parallel to each other, and wherein a corner of said substantially rectangular shape has an obtuse angle.

11. The circuit as recited in claim 10, further comprising a first contact hole for connecting said first diffusion region to said pad electrically, and a second contact hole and a third contact hole for connecting said second diffusion region to said discharge line.

12. The circuit as recited in claim 11, wherein a distance from said first contact hole to said second contact hole and a distance from said first contact hole to said third contact hole are substantially the same.

13. The circuit as recited in claim 12, wherein said substrate comprises a plurality of third diffusion regions having said second conductivity-type and having a depth deeper than that of said first and second diffusion regions, under said first, second and third contact holes.

14. The circuit as recited in claim 13, wherein said first conductivity-type comprises a P-type and said second conductivity-type comprises an N-type.

15. A semiconductor device having an electrostatic discharge protective circuit coupled between a pad and a discharge line, comprising:

a diode portion including a first diffusion region which is connected to said discharge line and has a first conductivity-type, and a second diffusion region which is connected to said pad and has a second conductivity-type, said first diffusion region being adjacent to said second diffusion region; and a bipolar transistor portion including a third diffusion region which is connected to said discharge line and has said second conductivity-type, a fourth diffusion region which is connected to said pad and has said second conductivity type, and a fifth diffusion region which is connected to said discharge line and has said second conductivity-type, wherein said first, second, third, fourth and fifth diffusion regions are formed in that order in a semiconductor layer of said first conductivity-type.

16. A semiconductor device having an electrostatic discharge protective circuit coupled between a pad and a discharge line, comprising:

a diode portion including a first diffusion region which is connected to said discharge line and has a first conductivity-type, and a second diffusion region which is connected to said pad and has a second conductivity-type, said first diffusion region being adjacent to said second diffusion region; and a bipolar transistor portion including a third diffusion region which is connected to said discharge line and has said second conductivity-type, a fourth diffusion region which is connected to said pad and has said second conductivity type, and a fifth diffusion region which is connected to said discharge line and has said second conductivity-type, wherein said second, first, third, fourth and fifth diffusion regions are formed in that order in a semiconductor layer of said first conductivity-type.

17. A semiconductor device having an electrostatic discharge protective circuit coupled between a pad and a discharge line, comprising:

a diode portion including a first diffusion region which is connected to said discharge line and has a first conductivity-type, and a second diffusion region which is connected to said pad and has a second conductivity-type, said first diffusion region being adjacent to said second diffusion region; and a bipolar transistor portion including a third diffusion region which is connected to said discharge line and has said second conductivity-type, a fourth diffusion region which is connected to said pad and has said second conductivity type, and a fifth diffusion region which is connected to said discharge line and has said second conductivity-type, wherein said diode portion further includes a sixth diffusion region which is connected to said discharge line and has said first conductivity-type, said sixth, second, first, third, fourth and fifth diffusion regions being formed in that order in a semiconductor layer of said first conductivity-type.

* * * * *